United States Patent
Liu et al.

(10) Patent No.: US 10,340,278 B1
(45) Date of Patent: Jul. 2, 2019

(54) SEMICONDUCTOR MEMORY DEVICE AND MANUFACTURING METHOD THEREOF

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Wei-Hsin Liu, Changhua County (TW); Cheng-Hsu Huang, New Taipei (TW); Jui-Min Lee, Taichung (TW); Yi-Wei Chen, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/885,729

(22) Filed: Jan. 31, 2018

(30) Foreign Application Priority Data

Jan. 16, 2018 (CN) .......................... 2018 1 0039341

(51) Int. Cl.
| | |
|---|---|
| *H01L 23/48* | (2006.01) |
| *H01L 27/108* | (2006.01) |
| *H01L 23/528* | (2006.01) |
| *H01L 21/3205* | (2006.01) |
| *H01L 21/768* | (2006.01) |
| *H01L 21/285* | (2006.01) |
| *H01L 23/532* | (2006.01) |

(52) U.S. Cl.
CPC .. *H01L 27/10894* (2013.01); *H01L 21/28556* (2013.01); *H01L 21/32053* (2013.01); *H01L 21/32055* (2013.01); *H01L 21/7685* (2013.01); *H01L 21/76856* (2013.01); *H01L 21/76864* (2013.01); *H01L 21/76879* (2013.01); *H01L 23/528* (2013.01); *H01L 23/5329* (2013.01); *H01L 23/53266* (2013.01); *H01L 23/53271* (2013.01); *H01L 27/10885* (2013.01); *H01L 27/10888* (2013.01); *H01L 27/10897* (2013.01); *H01L 27/10823* (2013.01)

(58) Field of Classification Search
None
See application file for complete search history.

(56) References Cited

U.S. PATENT DOCUMENTS

| | | | |
|---|---|---|---|
| 6,987,322 B2 * | 1/2006 | Chen | G03F 9/7076 257/750 |
| 7,247,920 B2 | 7/2007 | Weimer | |

* cited by examiner

*Primary Examiner* — Long Pham
(74) *Attorney, Agent, or Firm* — Winston Hsu (57) ABSTRACT

A semiconductor memory device includes a semiconductor substrate and a patterned conductive structure. The patterned conductive structure is disposed on the semiconductor substrate. The patterned conductive structure includes a first silicon conductive layer, a second silicon conductive layer, an interface layer, a barrier layer, and a metal conductive layer. The second silicon conductive layer is disposed on the first silicon conductive layer. The interface layer is disposed between the first silicon conductive layer and the second silicon conductive layer, and the interface layer includes oxygen. The barrier layer is disposed on the second silicon conductive layer. The metal conductive layer is disposed on the barrier layer.

17 Claims, 9 Drawing Sheets

SEMICONDUCTOR MEMORY DEVICE AND MANUFACTURING METHOD THEREOF

BACKGROUND OF THE INVENTION

1. Field of the Invention

The present invention relates to a semiconductor memory device and a manufacturing method thereof, and more particularly, to a semiconductor memory device including a patterned conductive structure and a manufacturing method thereof.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series.

The MOS transistors in the memory cells may have different structural design because of the product specification and/or the memory cell density requirements. Therefore, the structure of the MOS transistor in the memory cell may be different from that of transistors on other regions within the same chip, and the manufacturing process will become more complicated. Accordingly, it is very important for the related field to effectively integrate the manufacturing process of the memory cell and the manufacturing process of the devices in other regions.

SUMMARY OF THE INVENTION

A semiconductor memory device and a manufacturing method thereof are provided in the present invention. An interface layer is inserted into a silicon conductive layer in a patterned conductive structure, and the interface layer may be used to block boron penetration effects and prevent the silicon conductive layer from reacting with other material layers too seriously and forming defects. The manufacturing yield may be enhanced accordingly.

According to an embodiment of the present invention, a semiconductor memory device is provided. The semiconductor memory device includes a semiconductor substrate and a patterned conductive structure. The patterned conductive structure is disposed on the semiconductor substrate. The patterned conductive structure includes a first silicon conductive layer, a second silicon conductive layer, an interface layer, a barrier layer, and a metal conductive layer. The second silicon conductive layer is disposed on the first silicon conductive layer. The interface layer is disposed between the first silicon conductive layer and the second silicon conductive layer, and the interface layer includes oxygen. The barrier layer is disposed on the second silicon conductive layer. The metal conductive layer is disposed on the barrier layer.

According to an embodiment of the present invention, a manufacturing method of a semiconductor memory device is provided. The manufacturing method includes the following steps. A semiconductor substrate is provided, and a patterned conductive structure is formed on the semiconductor substrate. The patterned conductive structure includes a first silicon conductive layer, a second silicon conductive layer, an interface layer, a barrier layer, and a metal conductive layer. The second silicon conductive layer is disposed on the first silicon conductive layer. The interface layer is disposed between the first silicon conductive layer and the second silicon conductive layer, and the interface layer includes oxygen. The barrier layer is disposed on the second silicon conductive layer. The metal conductive layer is disposed on the barrier layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-8 are schematic drawings illustrating a manufacturing method of the semiconductor device according to the first embodiment of the present invention, wherein

DETAILED DESCRIPTION

Figure 1:
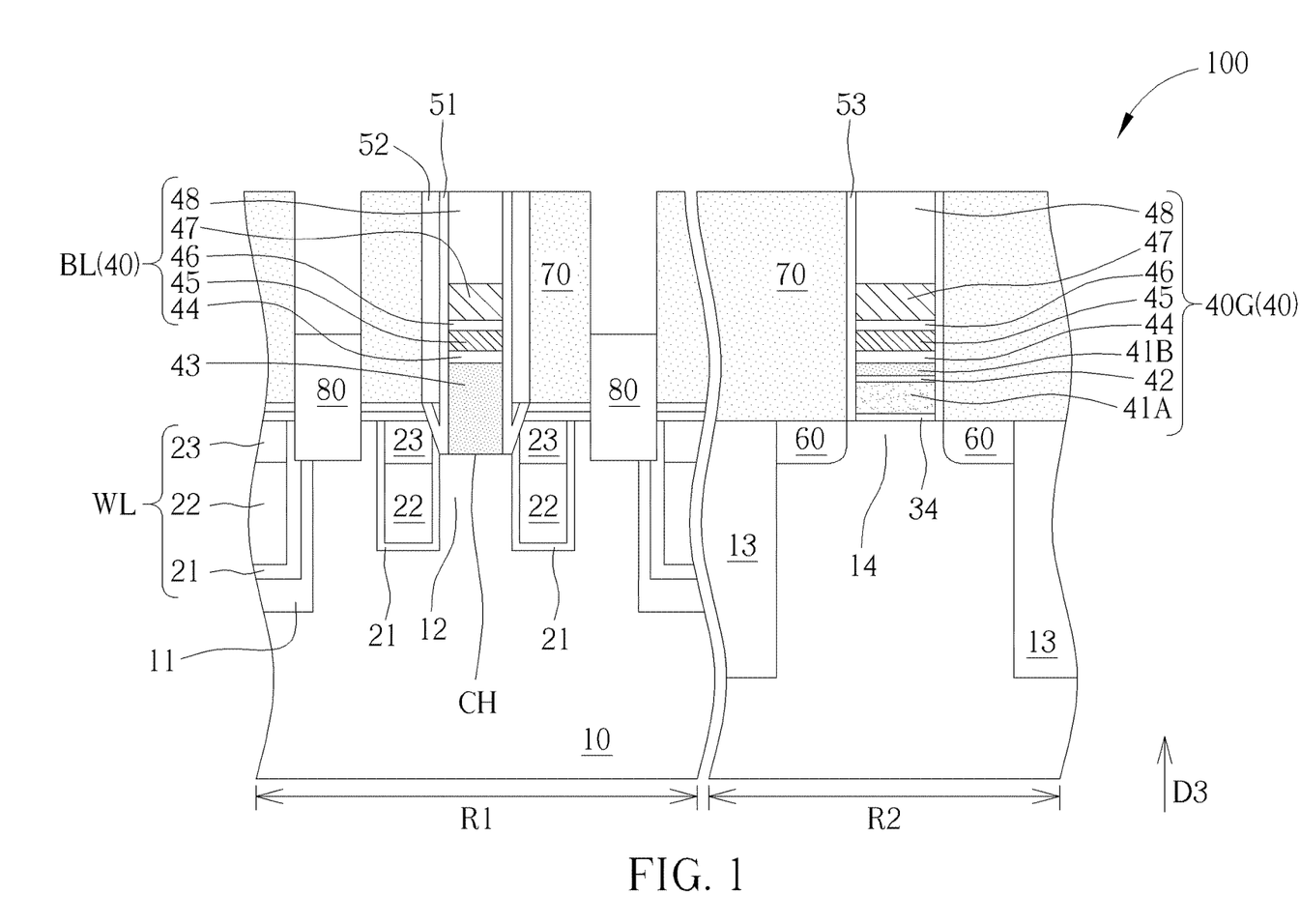
FIG. 1 is a schematic drawing illustrating a semiconductor memory device according to a first embodiment of the present invention.
Figure 2:
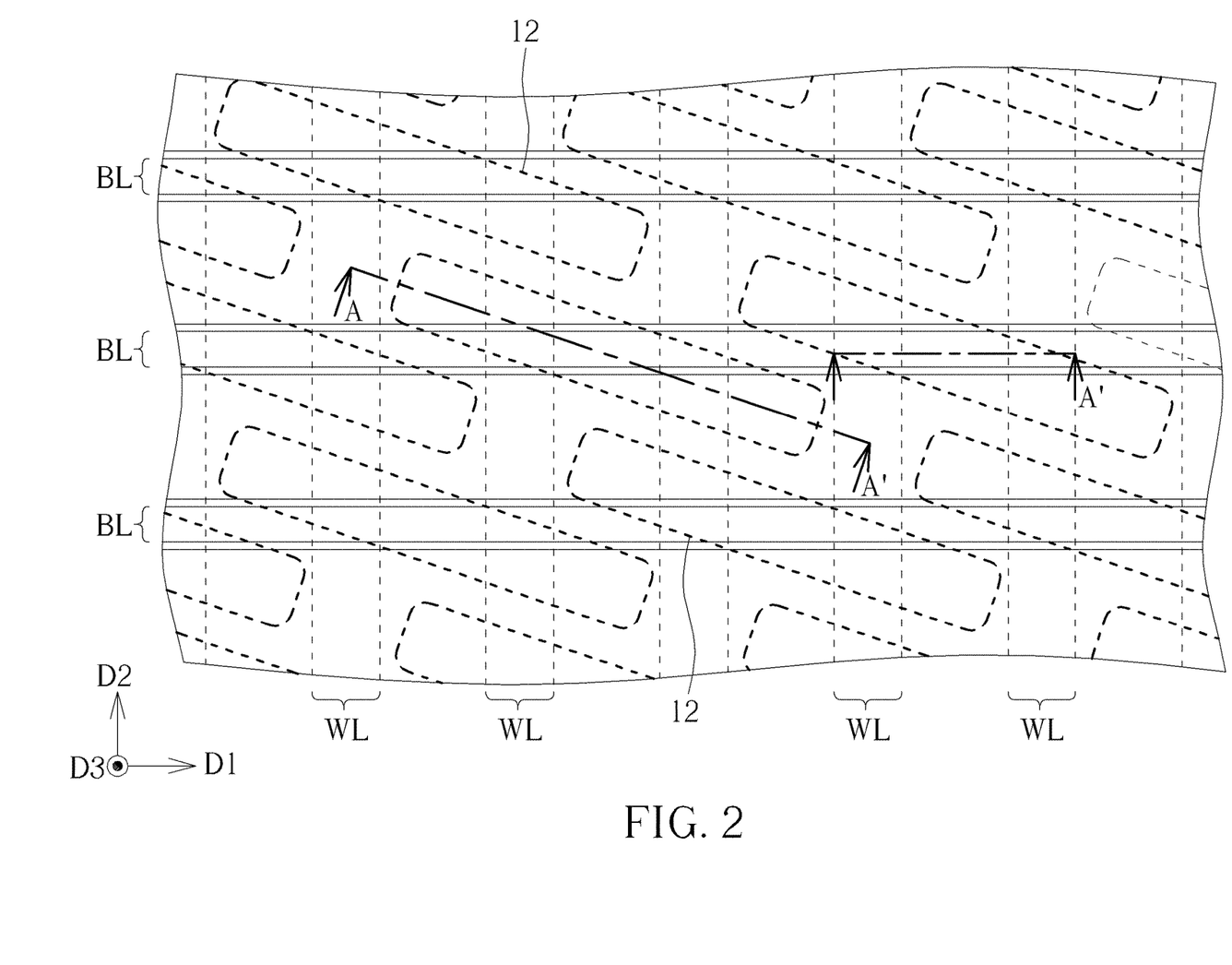
FIG. 2 is a top view schematic drawing illustrating the semiconductor memory device according to the first embodiment of the present invention.
Figure 3:
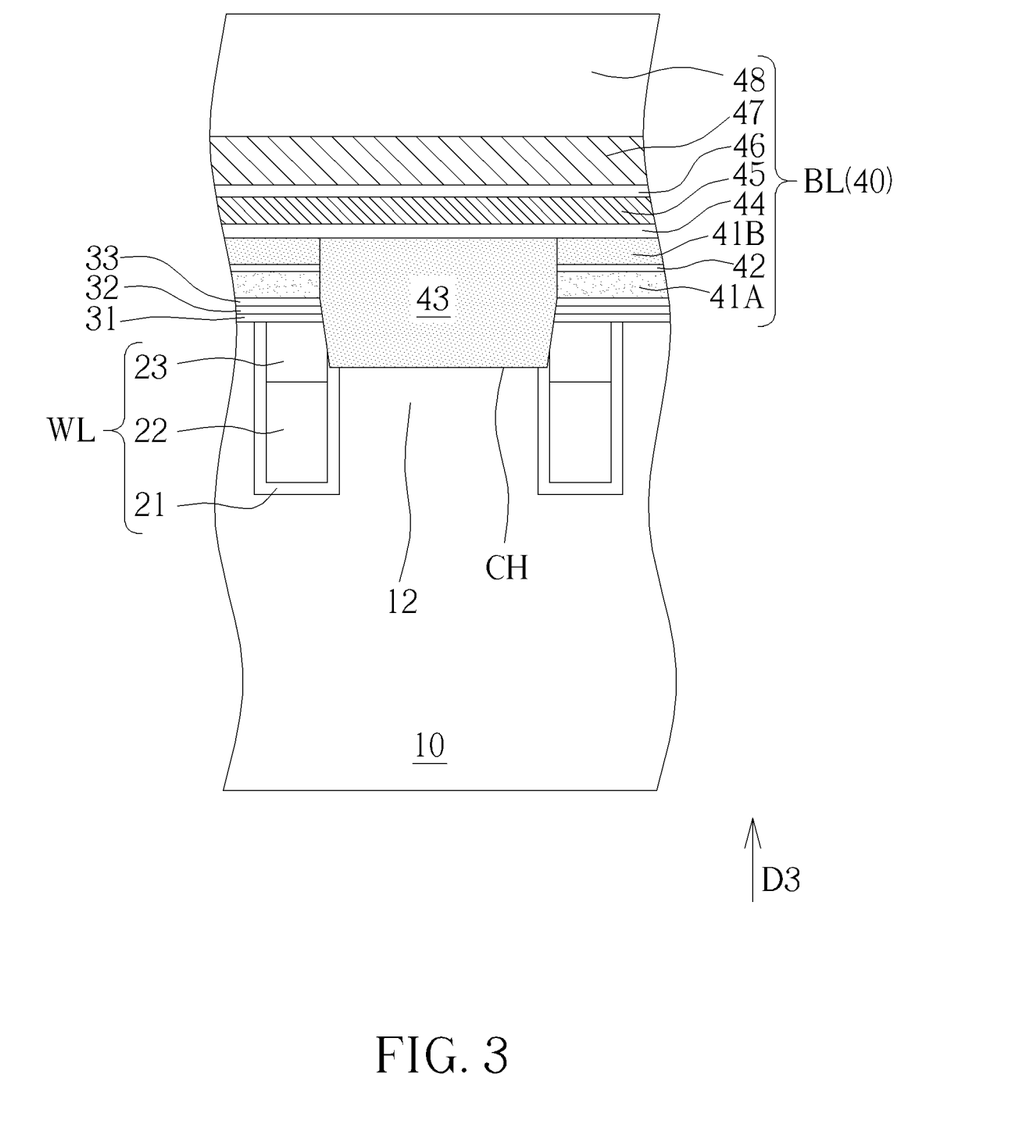
FIG. 3 is a cross-sectional diagram taken along a line B-B' in FIG. 2.

Please refer to FIGS. 1-3. FIG. 1 is a schematic drawing illustrating a semiconductor memory device according to a first embodiment of the present invention. FIG. 2 is a top view schematic drawing illustrating the semiconductor memory device according to the first embodiment of the present invention. The left part of FIG. 1 may be regarded as a cross-sectional diagram taken along a line A-A' in FIG. 2, and FIG. 3 is a cross-sectional diagram taken along a line B-B' in FIG. 2. As shown in FIGS. 1-3, a semiconductor memory device 100 is provided in this embodiment. The semiconductor memory device 100 includes a semiconductor substrate 10 and a patterned conductive structure 40. The patterned conductive structure 40 is disposed on the semiconductor substrate 10. The patterned conductive structure 40 includes a first silicon conductive layer 41A, a second silicon conductive layer 41B, an interface layer 42, a barrier layer 45, and a metal conductive layer 47. The second silicon conductive layer 41B is disposed on the first silicon conductive layer 41A. The interface layer 42 is disposed between the first silicon conductive layer 41A and the second silicon conductive layer 41B, and the interface layer 42 includes oxygen. The barrier layer 45 is disposed on the second silicon conductive layer 41B. The metal conductive layer 47 is disposed on the barrier layer 45. In some embodiments, the semiconductor substrate 10 may include a silicon substrate, an epitaxial substrate, a silicon germanium substrate, a silicon carbide substrate, or a silicon-on-insulator (SOI) substrate, but not limited thereto. A memory cell region R1 and a peripheral region R2 may be defined on the semiconductor substrate 10, and the patterned conductive structure 40 may be disposed on the memory cell region R1 and the peripheral region R2, but not limited thereto. In some embodiments, the patterned conductive structure 40 may be disposed on the memory cell region R1 only, disposed on the peripheral region R2 only, or be disposed on other regions of the semiconductor substrate 10 only.

In some embodiments, the patterned conductive structure 40 disposed on the memory cell region R1 may include a bit line structure BL, and the patterned conductive structure 40 disposed on the peripheral region R2 may include agate structure 40G. In other words, at least a part of the patterned conductive structure 40 disposed on the memory cell region R1 may be used as a bit line structure BL of a memory cell, and at least a part of the patterned conductive structure 40 disposed on the peripheral region R2 may be used as a gate structure 40G of a transistor on the peripheral region R2. The structure of the bit line structure BL may be similar to the structure of the gate structure 40G because the bit line structure BL and the gate structure 40G are formed by the patterned conductive structure 40. The semiconductor memory device 100 may include a plurality of the bit line structures BL. Each of the bit line structures BL may be elongated in a first direction D1, the bit line structures BL may be disposed repeatedly in a second direction D2, and the second direction D2 may be substantially orthogonal to the first direction D1, but not limited thereto. In other patterned conductive structure 40, the material of the first silicon conductive layer 41A and the second silicon conductive layer 41B may include polysilicon, amorphous silicon, or other non-metal conductive materials containing silicon, and the interface layer 42 may include silicon oxide, silicon oxynitride, or other interface materials containing oxygen and silicon. In some embodiments, the material of the first silicon conductive layer 41A may be identical to or different from the material of the second silicon conductive layer 41B. Additionally, the barrier layer 45 may include titanium (Ti), titanium nitride (TiN), tungsten nitride (WN), or other appropriate barrier materials. The metal conductive layer 47 may include aluminum, tungsten, copper, titanium aluminide, or other suitable metal conductive materials with low electrical resistivity. In some embodiments, a first silicide layer 44 may be formed between the second silicon conductive layer 41B and the barrier layer 45, and a second silicide layer 46 may be formed between the barrier layer 45 and the metal conductive layer 47, but not limited thereto. The first silicide layer 44 may include silicide of the material in the barrier layer 46, such as titanium silicide (TiSi), and the second silicide layer 46 may include silicide of the material in the metal conductive layer 47, such as tungsten silicide (WSi), but not limited thereto.

The interface layer 42 located between the first silicon conductive layer 41A and the second silicon conductive layer 41B in a thickness direction of the semiconductor substrate 10 (such as a third direction D3 shown in FIGS. 1-3) may be used to block the dopants in the second silicon conductive layer 41B from penetrating downwards (such as the boron penetration effect), and the electrical performance of the semiconductor memory device 100 may be enhanced accordingly. Additionally, the interface layer 42 may also be used to block the material in the barrier layer 45 (such as titanium) from diffusing downwards and reacting with silicon for forming silicide or generating defects, and the manufacturing yield may be improved accordingly. Therefore, the interface layer 42 maybe remarkably thinner than the first silicon conductive layer 41A and the second silicon conductive layer 41B. For example, the thickness of the interface layer 42 may be less than or equal to 50 angstroms (Å), and the total thickness of the first silicon conductive layer 41A and the second silicon conductive layer 41B may be about 300 angstroms, but not limited thereto. In some embodiments, for enhancing the performance of blocking the boron penetration effect described above, the location of the interface layer 42 may be modified to be relatively lower, and the thickness of the first silicon conductive layer 41A may be smaller than the thickness of the second silicon conductive layer 41B. In some embodiments, for enhancing the above mentioned performance of blocking the material in the barrier layer 45 from diffusing downwards, the location of the interface layer 42 may be modified to be relatively higher, and the thickness of the first silicon conductive layer 41A may be greater than the thickness of the second silicon conductive layer 41B. In other words, the ratio of the thickness of the first silicon conductive layer 41A to the thickness of the second silicon conductive layer 41B may be modified for forming the interface layer 42 at the required position according to different requirements.

Specifically, in the memory cell region R1, a first trench isolation 11 may be formed in the semiconductor substrate 10 for defining a plurality of first active regions 12. Comparatively, in the peripheral region R2, a second trench isolation 13 may be formed in the semiconductor substrate 10 for defining a second active region 14. The first trench isolation 11 and the second trench isolation 13 may respectively include a single layer or multiple layers of insulation material, such as silicon nitride, silicon oxynitride, silicon carbonitride (SiCN), or other suitable insulation materials. Additionally, word line structures WL may be formed in the semiconductor substrate 10, and the word line structures WL may be buried word lines, but not limited thereto. Each of the word line structures WL may be elongated in the second direction D2, and each of the word line structures WL may include a word line dielectric layer 21, a word line 22, and a word line cap layer 23, but not limited thereto. Trenches may be formed in the semiconductor substrate 10, and the word line dielectric layer 21, the word line 22, and the word line cap layer 23 mentioned above may be sequentially formed in the trench, but not limited thereto. In some embodiments, the other types of word line structures may also be applied according to other considerations. Additionally, the word line dielectric layer 21 may include silicon oxide or other suitable dielectric materials, the word line 22 may include aluminum, tungsten, copper, titanium aluminide (TiAl), or other suitable conductive materials, and the word line cap layer 23 may include silicon nitride, silicon oxynitride, silicon carbonitride, or other suitable insulation materials. Mask layers such as a first mask layer 31, a second mask layer 32, and a third mask layer 33 may be disposed on the word line structures WL. In some embodiments, the first mask layer 31, the second mask layer 32, and the third mask layer 33 may be an interface layer composed of an oxide-nitride-oxide (ONO) structure, but not limited thereto. For example, the first mask layer 31 may be a silicon oxide layer, the second mask layer 32 may be a silicon nitride layer, and the third mask layer 33 may be a silicon oxide layer, but not limited thereto.

In some embodiments, the semiconductor memory device 100 may further include a bit line contact structure 43 disposed on the memory cell region R1, and the bit line contact structure 43 may be disposed between the barrier layer 45 and the semiconductor substrate 10 in the third direction D3. The bit line structure BL may be electrically connected with the corresponding first active region 12 via the bit line contact structure 43, and the bit line contact structure 43 may include a metal conductive material or a non-metal conductive material, such as polysilicon, amorphous silicon, or other non-metal conductive material containing silicon, but not limited thereto. As shown in FIG. 3, in some embodiments, the bit line contact structure 43 may penetrate the first silicon conductive layer 41A, the interface layer 42, and the second silicon conductive layer 41B, and the bit line contact structure 43 may directly contact the first silicon conductive layer 41A, the interface layer 42, and the second silicon conductive layer 41B, but not limited thereto. Additionally, at least a part of the bit line contact structure 43 may be disposed in a contact hole CH penetrating the first silicon conductive layer 41A, the interface layer 42, and the second silicon conductive layer 41B. Spacers such as a first spacer 51 and a second spacer 52 may be formed on sidewalls of the bit line structure BL, and at least a part of the spacer, such as the first spacer 51, may be partially disposed in the contact hole CH. In addition, the semiconductor memory device 100 may further include an isolation structure 70 disposed on the semiconductor substrate 10, and storage node contacts 80 may be formed in openings of the isolation structure 70 and electrically connected with the corresponding first active regions 12. The isolation structure 70 may include silicon nitride, silicon oxynitride, silicon carbonitride, or other suitable insulation materials, and the storage node contacts 80 may include amorphous silicon, polysilicon, or other conductive materials including silicon or not.

In the peripheral region R2, a gate dielectric layer 34 may be disposed between the gate structure 40G and the second active region 14, a third spacer 53 may be formed on the sidewalls of the gate structure 40G, and doped regions 60 may be formed in the second active region 14 at two sides of the gate structure 40G for being used as source/drain regions of a transistor, but not limited thereto. In some embodiments, the patterned conductive structure 40 may further include a first cap layer 48 disposed on the metal conductive layer 47, and the first cap layer 48 may include silicon nitride, silicon oxide, or other suitable insulation materials.

Please refer to FIGS. 1-8. FIGS. 4-8 are schematic drawings illustrating a manufacturing method of the semiconductor device according to the first embodiment of the present invention, and FIGS. 1-3 may be regarded as schematic drawings in a step subsequent to FIG. 8. As shown in FIGS. 1-3, the manufacturing method of the semiconductor memory device in this embodiment may include the following steps. Firstly, the semiconductor substrate 10 is provided, and the patterned conductive structure 40 is formed on the semiconductor substrate 10. The patterned conductive structure 40 includes the first silicon conductive layer 41A, the second silicon conductive layer 41B, the interface layer 42, the barrier layer 45, and the metal conductive layer 47. The second silicon conductive layer 41B is disposed on the first silicon conductive layer 41A. The interface layer 42 is disposed between the first silicon conductive layer 41A and the second silicon conductive layer 41B, and the interface layer 42 includes oxygen. The barrier layer 45 is disposed on the second silicon conductive layer 41B. The metal conductive layer 47 is disposed on the barrier layer 45.

Figure 4:
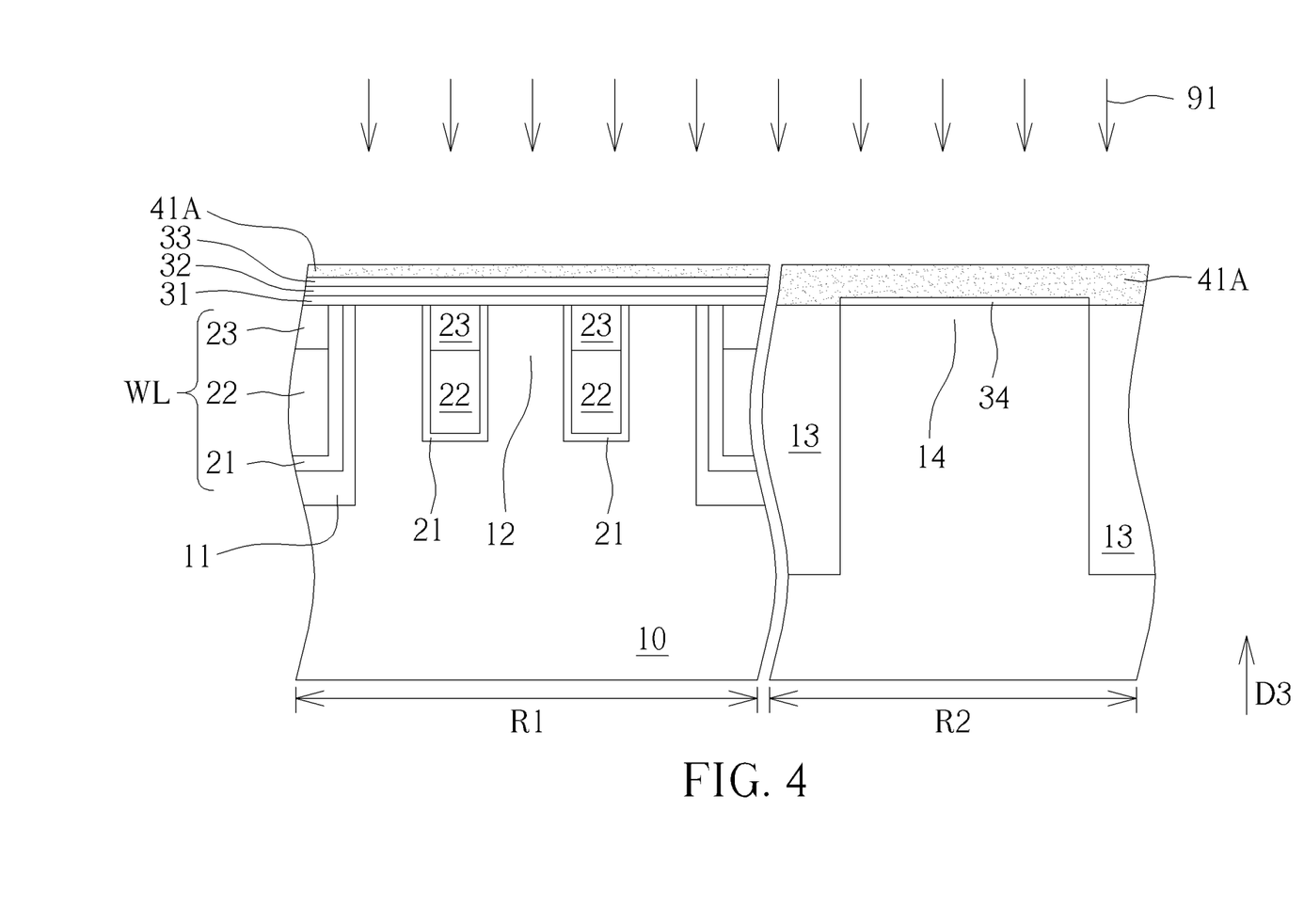
Figure 5:
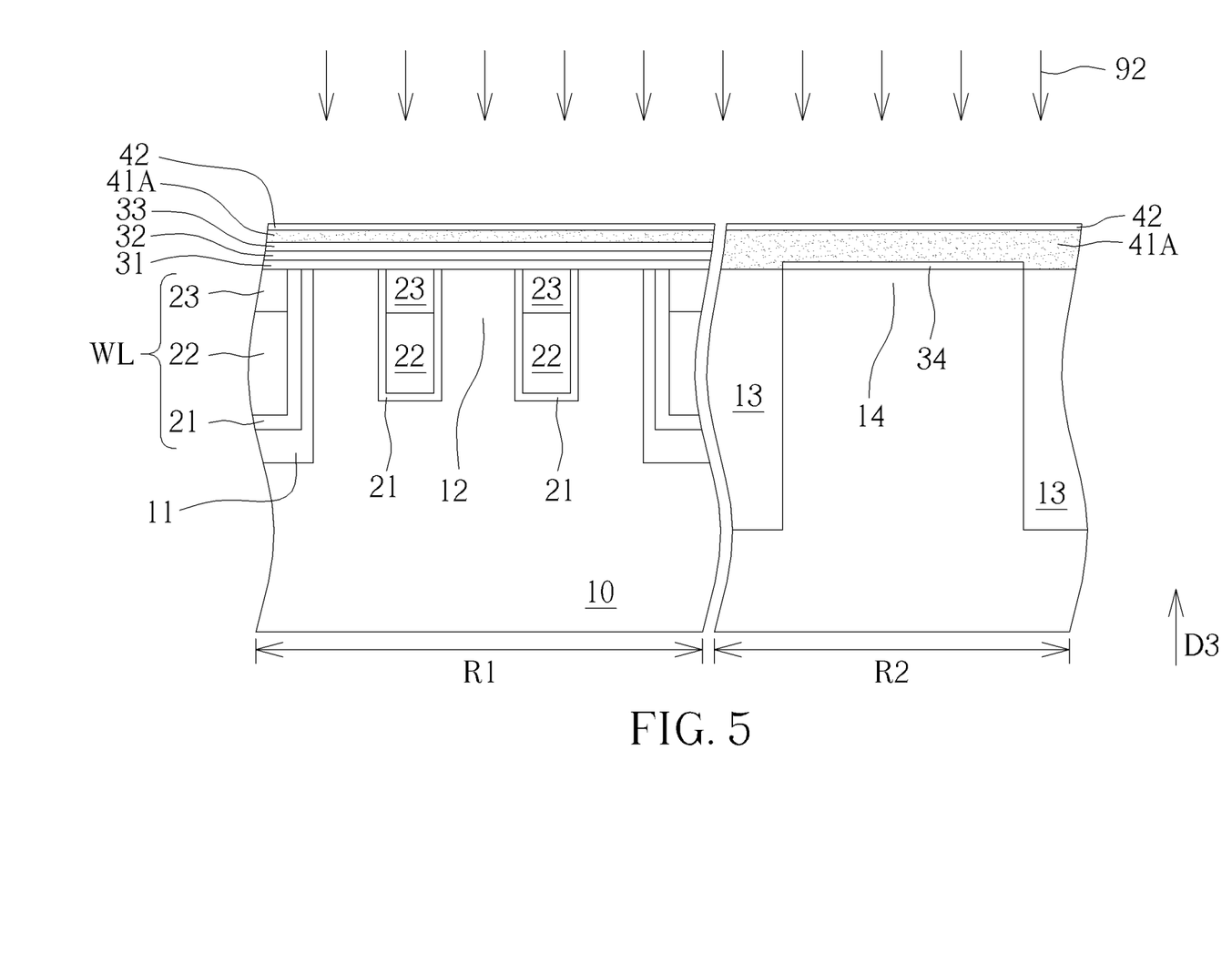
FIG. 5 is a schematic drawing in a step subsequent to FIG. 4.
Figure 6:
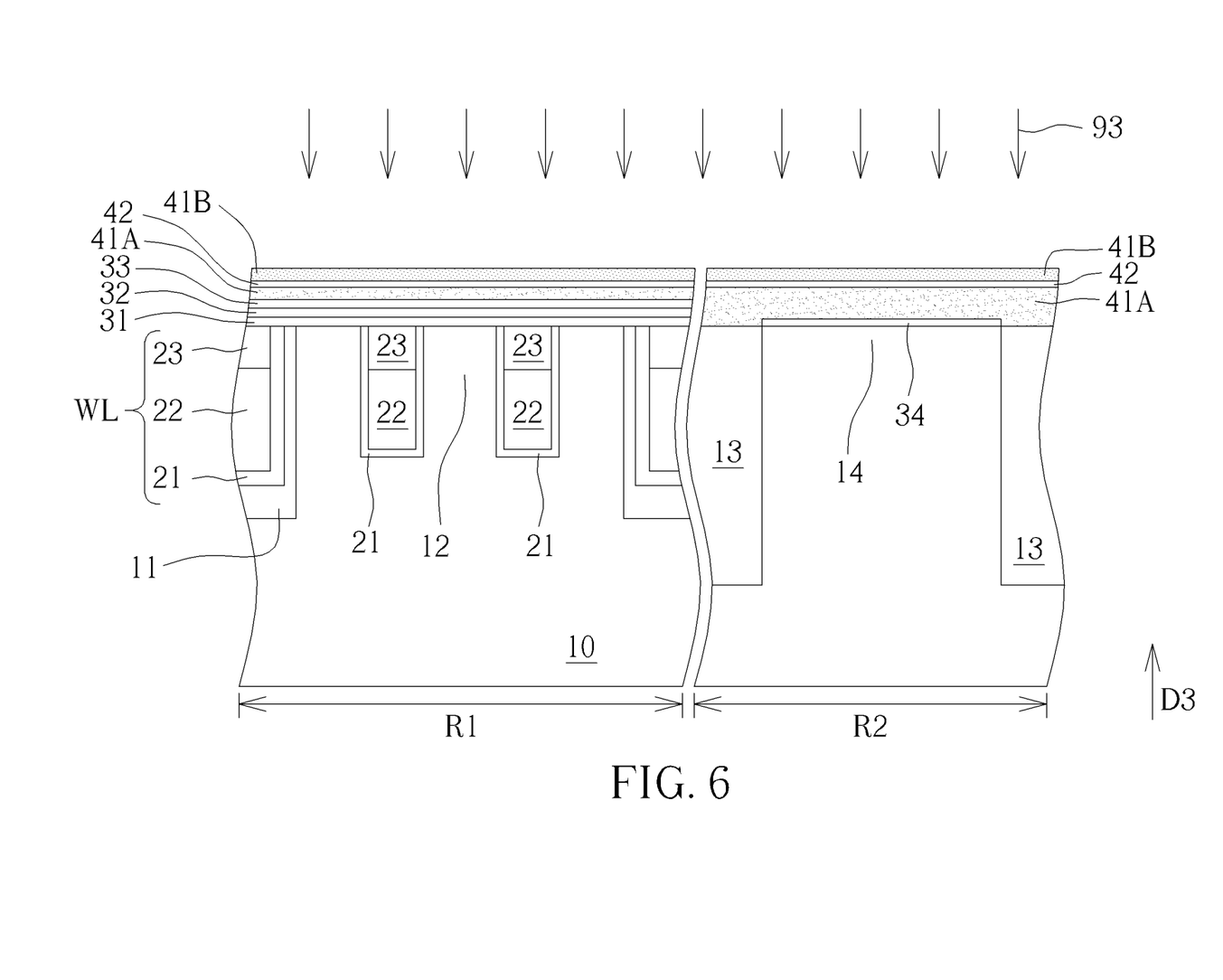
FIG. 6 is a schematic drawing in a step subsequent to FIG. 5.
Figure 7:
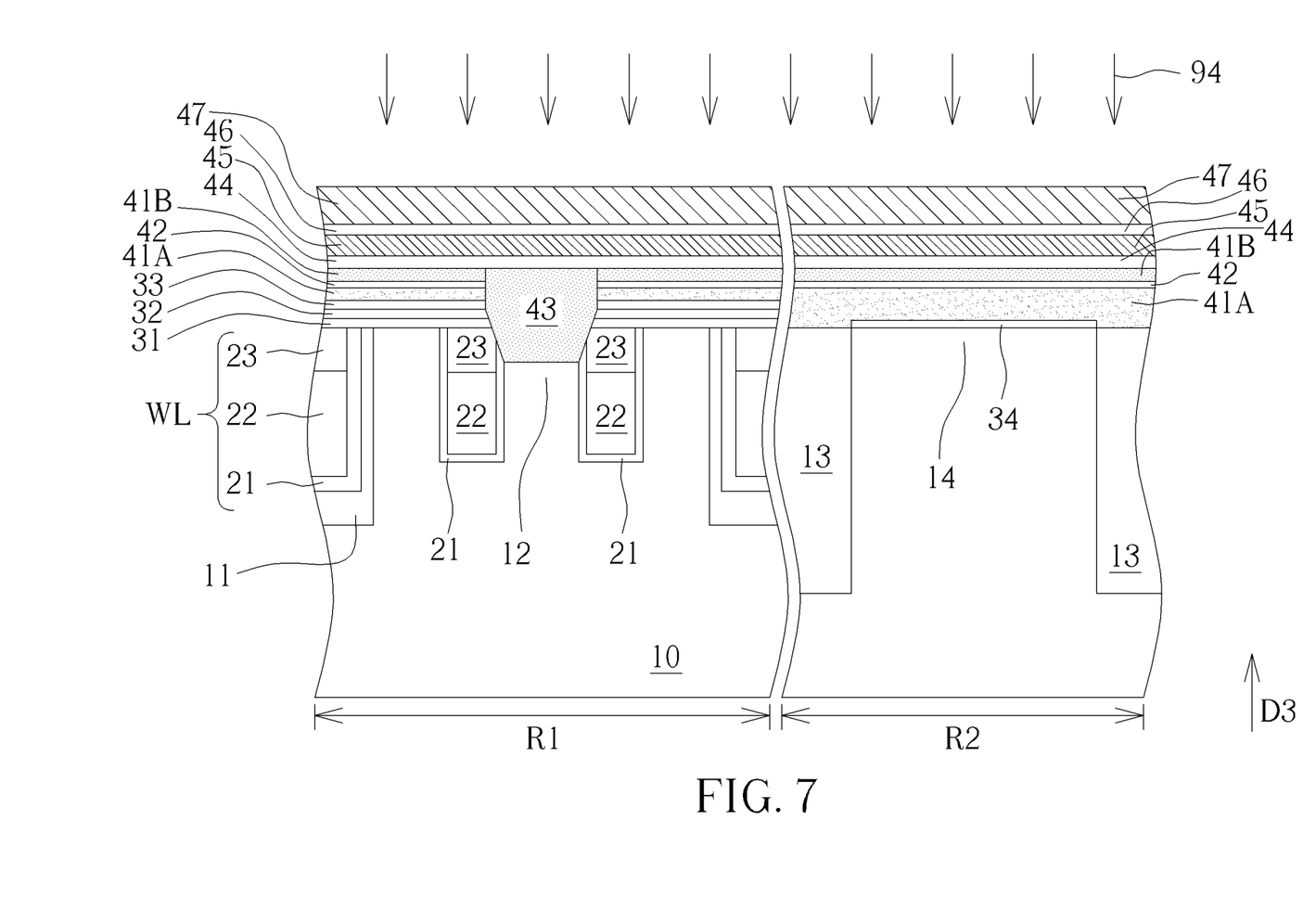
FIG. 7 is a schematic drawing in a step subsequent to FIG. 6.

Specifically, the manufacturing method of the semiconductor memory device 100 in this embodiment may include but is not limited to the following steps. As shown in FIG. 4, after the step of forming the third mask layer 33, a first deposition process 91 is performed to form the first silicon conductive layer 41A on the memory cell region R1 and the peripheral region R2 of the semiconductor substrate 10. Subsequently, as shown in FIG. 5, a first treatment 92 is performed to a top surface of the first silicon conductive layer 41A for forming the interface layer 42. In some embodiments, the first treatment 92 may include a nitrous oxide ($N_2O$) treatment or other suitable oxidation treatments. Subsequently, as shown in FIG. 6, a second deposition process 93 is performed to form the second silicon conductive layer 41B on the interface layer 42. As shown in FIGS. 4-6, in some embodiments, the first deposition process 91, the first treatment 92, and the second deposition process 93 may be performed in the same chemical vapor deposition apparatus and/or in the same process chamber. In other words, the first treatment 92 may be regarded as an in-situ treatment, but not limited thereto. As shown in FIG. 7, the barrier layer 45 and the metal conductive layer 47 are then formed on the second silicon conductive layer 41B, and a thermal anneal process 94 is performed after the step of forming the metal conductive layer 47. In some embodiments, the thermal anneal process 94 may include a rapid thermal processing (RTP), but not limited thereto. It is worth noting that, in some embodiments, the bit line contact structure 43 may be formed on the memory cell region R1 before the step of forming the barrier layer 45 and the metal conductive layer 47. The bit line contact structure 43 may be formed in the contact hole CH penetrating the second silicon conductive layer 41B, the interface layer 42, the first silicon conductive layer 41A, the third mask layer 33, the second mask layer 32, and the first mask layer 31, and the bit line contact structure 43 may directly contact the first silicon conductive layer 41A, the interface layer 42, and the second silicon conductive layer 41B, but not limited thereto.

Figure 8:
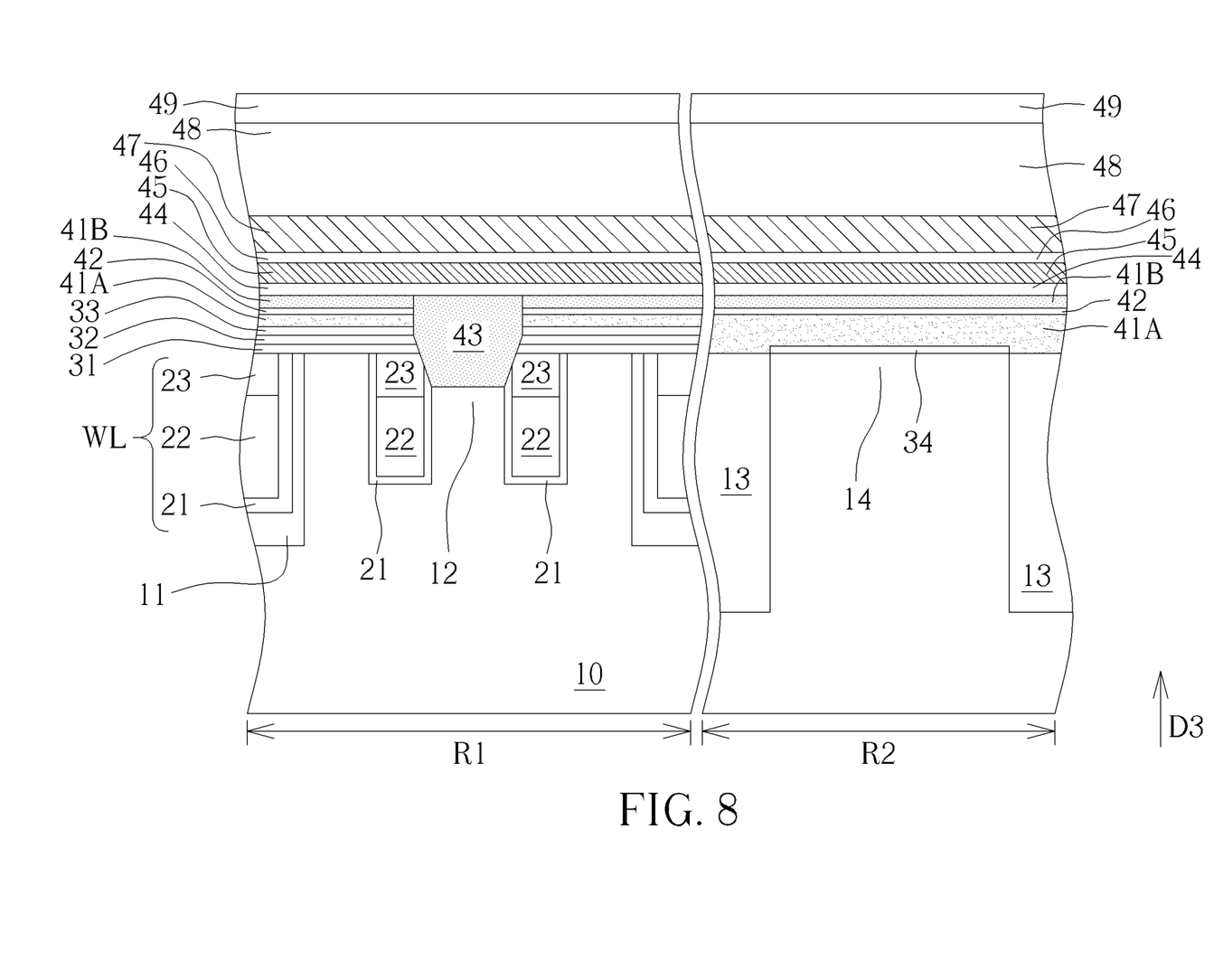
FIG. 8 is a schematic drawing in a step subsequent to FIG. 7.

As shown in FIG. 7 and FIG. 8, after the thermal anneal process 94, the first cap layer 48 and a second cap layer 49 are formed on the metal conductive layer 47, and the second cap layer 49 may include silicon nitride, silicon oxide, or other suitable insulation materials. Subsequently, as shown in FIG. 1, a patterning process is performed to the first silicon conductive layer 41A, the interface layer 42, the second silicon conductive layer 41B, the first silicide layer 44, the barrier layer 45, the second silicide layer 46, and the metal conductive layer 47 for forming the patterned conductive structure 40, and the above mentioned parts, such as the first spacer 51, the second spacer 52, the third spacer 53, the doped regions 60, the isolation structure 70, and the storage node contacts 80, may be formed after the step of forming the patterned conductive structure 40. In other words, the barrier layer 45 and the metal conductive layer 47 may be patterned by the process patterning the first silicon conductive layer 41A, the interface layer 42, and the second silicon conductive layer 41B, and the barrier layer 45 and the metal conductive layer 47 may be formed after the second deposition process mentioned above and before the patterning process mentioned above, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
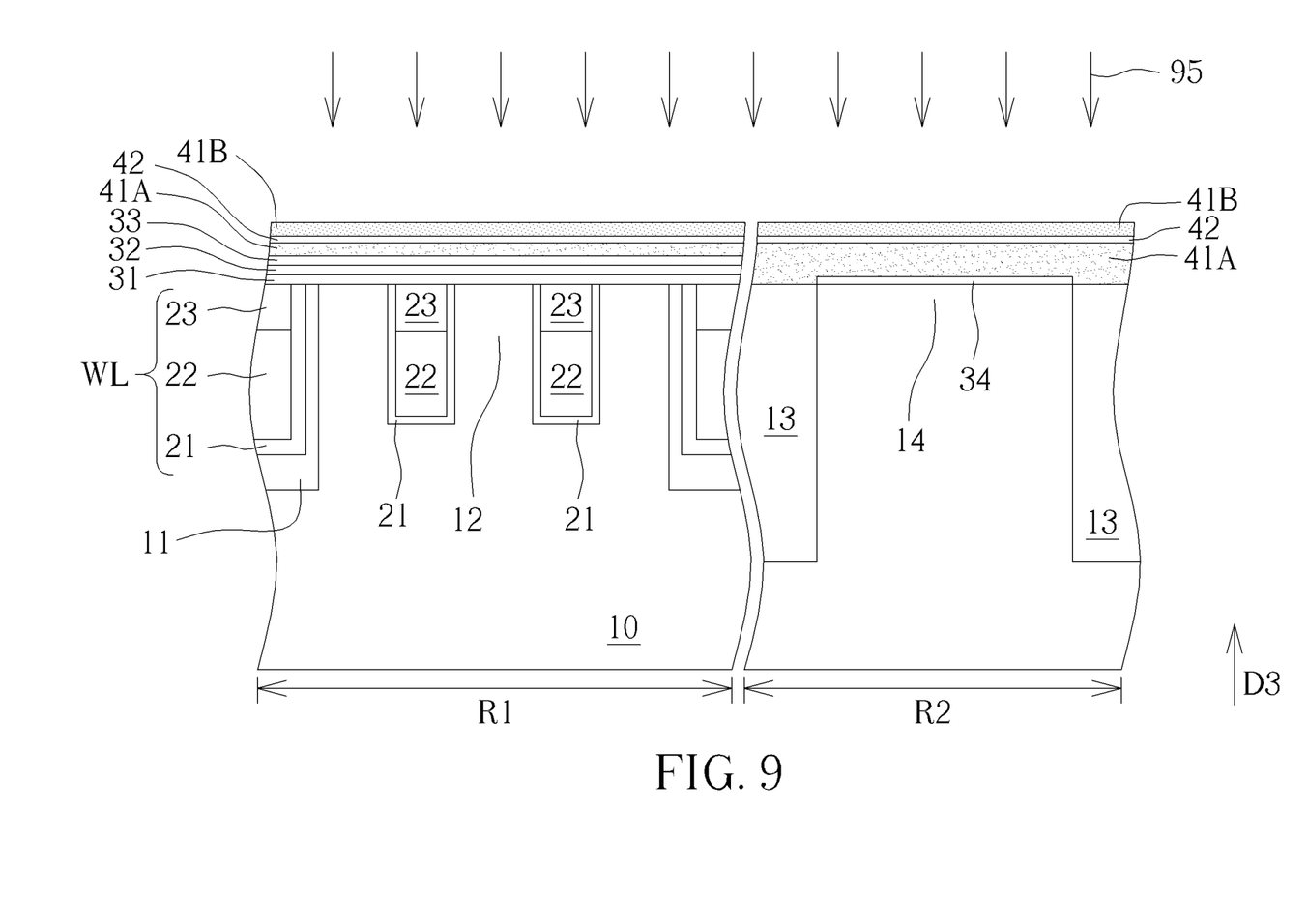
FIG. 9 is a schematic drawing illustrating a manufacturing method of a semiconductor device according to a second embodiment of the present invention.

Please refer to FIG. 6, FIG. 7, and FIG. 9. FIG. 9 is a schematic drawing illustrating a manufacturing method of a semiconductor device according to a second embodiment of the present invention. FIG. 9 may be regarded as a schematic drawing in a step subsequent to FIG. 6, and FIG. 7 may be regarded as a schematic drawing in a step subsequent to FIG. 9. As shown in FIG. 6, FIG. 7, and FIG. 9, the difference between the manufacturing method in this embodiment and the manufacturing method in the first embodiment described above is that the manufacturing method in this embodiment may further include performing a second treatment 95 to a top surface of the second silicon conductive layer 41B before the step of forming the barrier layer 45. In some embodiments, the second treatment 95 may include a nitridation treatment, such as a decoupled plasma nitridation (DPN) treatment. The second treatment 95 may be used to form a silicon nitride barrier layer on the top surface of the second silicon conductive layer 41B for preventing the second silicon conductive layer 41B from reacting with the barrier layer 45 too severely in the high temperature environment of the thermal anneal process 94 performed subsequently and generating defects. In some embodiments, the nitridation depth in the second silicon conductive layer 41B may range from 10 angstroms to 30 angstroms, but not limited thereto.

To summarize the above descriptions, according to the semiconductor memory device and the manufacturing method thereof in the present invention, the interface layer may be formed on the first silicon conductive layer by a surface treatment, and the second silicon conductive layer is then formed on the interface layer. The interface layer may be used to block the boron penetration effect and prevent the silicon conductive layer from reacting with other material layers too seriously and forming defects in the subsequent processes. The electrical performance of the semiconductor memory device may be improved and the manufacturing yield may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a semiconductor substrate, wherein a memory cell region and a peripheral region are defined on the semiconductor substrate;
   a patterned conductive structure disposed on the semiconductor substrate, wherein the patterned conductive structure is disposed on the memory cell region and the peripheral region, and the patterned conductive structure comprises:
   a first silicon conductive layer;
   a second silicon conductive layer disposed on the first silicon conductive layer;
   an interface layer disposed between the first silicon conductive layer and the second silicon conductive layer, wherein the interface layer comprises oxygen;
   a barrier layer disposed on the second silicon conductive layer; and
   a metal conductive layer disposed on the barrier layer, wherein the patterned conductive structure disposed on the memory cell region comprises a bit line structure; and
   a bit line contact structure disposed on the memory cell region, wherein the bit line contact structure is disposed between the barrier layer and the semiconductor substrate.

2. The semiconductor memory device according to claim 1, wherein the bit line contact structure directly contacts the first silicon conductive layer, the interface layer, and the second silicon conductive layer.

3. The semiconductor memory device according to claim 1, wherein the patterned conductive structure disposed on the peripheral region comprises a gate structure.

4. The semiconductor memory device according to claim 1, wherein a material of the second silicon conductive layer is identical to a material of the first silicon conductive layer.

5. The semiconductor memory device according to claim 1, wherein the interface layer is thinner than the first silicon conductive layer and the second silicon conductive layer.

6. The semiconductor memory device according to claim 1, wherein the thickness of the interface layer is less than or equal to 50 angstroms (Å).

7. The semiconductor memory device according to claim 1,
   wherein the interface layer comprises silicon oxide or silicon oxynitride.

8. A manufacturing method of a semiconductor memory device, comprising:
   providing a semiconductor substrate, wherein a memory cell region and a peripheral region are defined on the semiconductor substrate;
   forming a patterned conductive structure on the semiconductor substrate, wherein the patterned conductive structure is formed on the memory cell region and the peripheral region, and the patterned conductive structure comprises:
   a first silicon conductive layer;
   a second silicon conductive layer disposed on the first silicon conductive layer;
   an interface layer disposed between the first silicon conductive layer and the second silicon conductive layer, wherein the interface layer comprises oxygen;
   a barrier layer disposed on the second silicon conductive layer; and
   a metal conductive layer disposed on the barrier layer, wherein the patterned conductive structure formed on the memory cell region comprises a bit line structure; and
   forming a bit line contact structure on the memory cell region, wherein the bit line contact structure is disposed between the barrier layer and the semiconductor substrate.

9. The manufacturing method of the semiconductor memory device according to claim 8, wherein the step of forming the patterned conductive structure comprises:
   performing a first deposition process to form the first silicon conductive layer on the semiconductor substrate;
   performing a first treatment to a top surface of the first silicon conductive layer for forming the interface layer;
   performing a second deposition process to form the second silicon conductive layer on the interface layer; and
   performing a patterning process to the first silicon conductive layer, the interface layer, and the second silicon conductive layer.

10. The manufacturing method of the semiconductor memory device according to claim 9, wherein the first treatment comprises a nitrous oxide ($N_2O$) treatment.

11. The manufacturing method of the semiconductor memory device according to claim 9, wherein the first deposition process, the first treatment, and the second deposition process are performed in the same chemical vapor deposition apparatus.

12. The manufacturing method of the semiconductor memory device according to claim 9, further comprising:
   performing a thermal anneal process after the step of forming the metal conductive layer, wherein the barrier layer and the metal conductive layer are formed after the second deposition process and before the patterning process.

13. The manufacturing method of the semiconductor memory device according to claim 12, further comprising:
   performing a second treatment to a top surface of the second silicon conductive layer before the step of forming the barrier layer, wherein the second treatment comprises a nitridation treatment.

14. The manufacturing method of the semiconductor memory device according to claim 8, wherein the patterned conductive structure formed on the peripheral region comprises a gate structure.

15. The manufacturing method of the semiconductor memory device according to claim 8, wherein the bit line contact structure directly contacts the first silicon conductive layer, the interface layer, and the second silicon conductive layer.

16. The manufacturing method of the semiconductor memory device according to claim 8, wherein the interface layer is thinner than the first silicon conductive layer and the second silicon conductive layer.

17. The manufacturing method of the semiconductor memory device according to claim 8, wherein the interface layer comprises silicon oxide or silicon oxynitride.

* * * * *